(12) United States Patent
Müller

(10) Patent No.: US 7,466,601 B2
(45) Date of Patent: Dec. 16, 2008

(54) OUTPUT DRIVER

(75) Inventor: David Müller, Unterhaching (DE)

(73) Assignee: Qimonda AG, Munich (DE)

( * ) Notice: Subject to any disclaimer, the term of this patent is extended or adjusted under 35 U.S.C. 154(b) by 194 days.

(21) Appl. No.: 11/607,518

(22) Filed: Dec. 1, 2006

(65) Prior Publication Data
US 2008/0212385 A1  Sep. 4, 2008

(51) Int. Cl.
*G11C 7/10* (2006.01)
(52) U.S. Cl. .................. 365/189.05; 365/211; 326/32; 327/362; 327/378
(58) Field of Classification Search ............ 365/211
See application file for complete search history.

(56) References Cited

U.S. PATENT DOCUMENTS

| 5,808,478 | A  | * | 9/1998 | Andresen ................... 326/31 |
| 5,869,983 | A  | * | 2/1999 | Ilkbahar et al. ............. 326/83 |
| 6,985,014 | B2 | * | 1/2006 | Ajit ........................... 327/108 |
| 7,271,613 | B1 | * | 9/2007 | La Fetra et al. ............. 326/30 |

\* cited by examiner

*Primary Examiner*—Tan T. Nguyen

(57) ABSTRACT

According to one embodiment a semiconductor device is provided. The device includes a first compensator to generate a first compensated signal and a first limiter to control operation of the first compensator. Furthermore, a second compensator to generate a second compensated signal and a second limiter to control operation of the second compensator is provided. An output device is adapted to receive the first compensated signal and the second compensated signal to drive an output.

22 Claims, 7 Drawing Sheets

US 7,466,601 B2

OUTPUT DRIVER

BACKGROUND

The present invention relates to an output driver for a semiconductor device. In many applications, semiconductor devices generate output signals for use by peripheral devices. It is generally desirable to have a stable transition of these signals from a logic low state to a logic high state and vice versa.

The rate of this transition is called the slew rate and is usually measured as the change in voltage over time (V/time). In current high speed applications, the slew rate is typically around 2, 3 or 4 V/ns in order of magnitude. Often these numbers are specified with a narrow tolerance because transitions that occur too quickly can cause crosstalk with neighbouring signals, while transitions that occur too slowly can cause inter symbol interference. Both effects can cause data dependent jitter and therefore a reduction of the data eye.

Achieving of a stable slew rate in view of process, voltage, and temperature (PVT) variations is important if an integrated circuit, for instance, has to fulfill the specifications. The specifications may be defined within system or product data sheets or the like. Due to PVT variations the slew rate of an output signal could vary, thus a suitable technique to cope with such variations is needed.

SUMMARY

According to one embodiment of the invention a semiconductor device is provided. The device includes a first compensator to generate a first compensated signal and a first limiter to control operation of the first compensator. Additionally, a second compensator to generate a second compensated signal and a second limiter to control operation of the second compensator is provided. An output device is adapted to receive the first compensated signal and the second compensated signal to drive an output.

BRIEF DESCRIPTION OF THE DRAWINGS

The accompanying drawings are included to provide a further understanding of the invention, and are incorporated in and constitute a part of this specification. The drawings illustrate embodiments of the present invention and together with the description serve to explain the principles of the invention. Other embodiments of the present invention will be readily appreciated as they become better understood by reference to the following detailed description. Like reference numerals designate corresponding parts.

DETAILED DESCRIPTION

Figure 1:
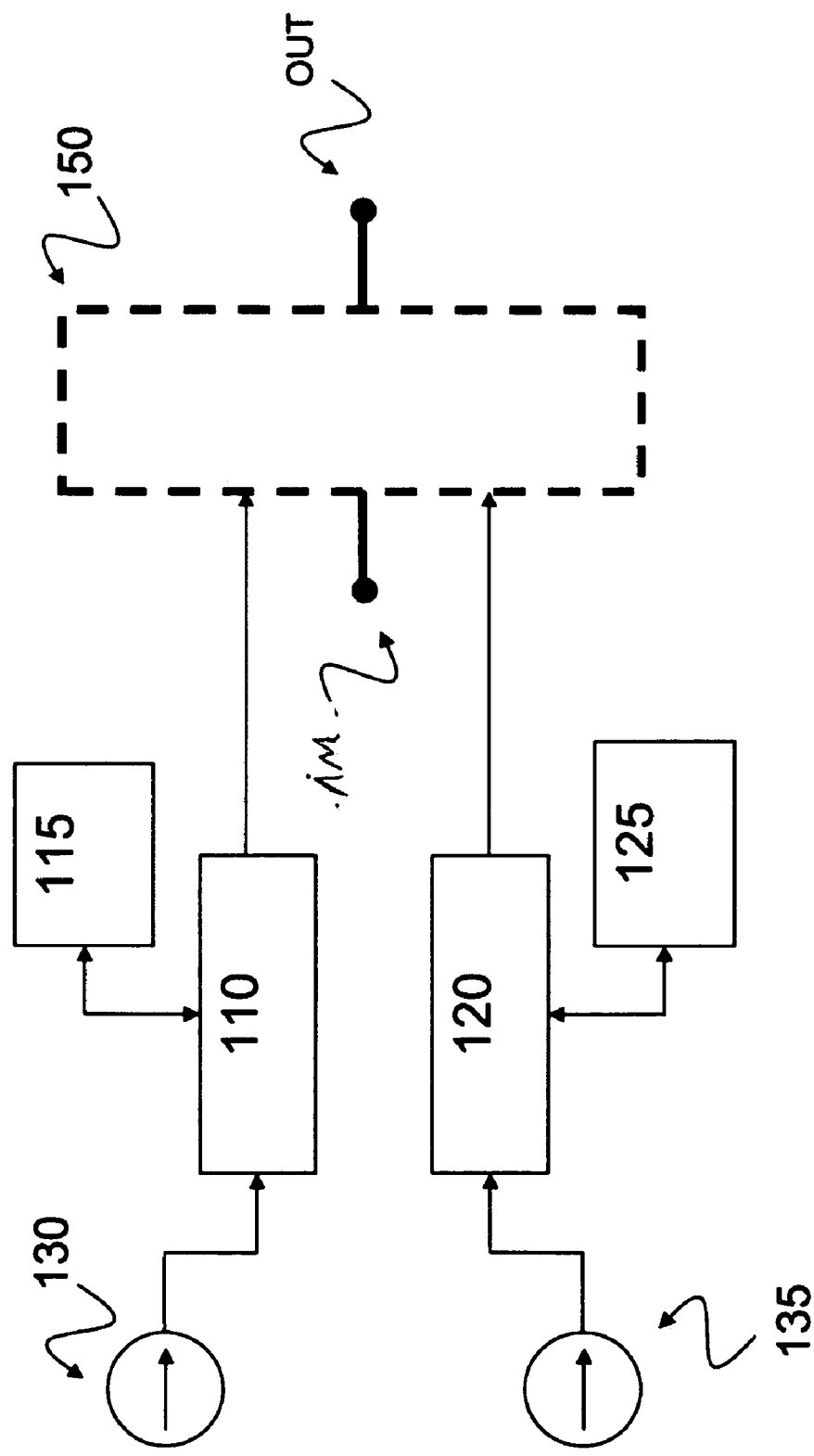
FIG. 1 shows a driver according to an embodiment of the present invention.

FIG. 1 illustrates an off chip driver (OCD) device according to one embodiment of the invention.

The term PVT dependent signal describes a PVT signal which is dependent on process, supply voltage and temperature variations. The circuitry according to this embodiment is arranged to compensate for signal variations resulting from PVT variations. Other signals or combinations of signals are also conceivable, which means that the circuitry according to this embodiment could be used with other variations of signals and combination of signals in addition to PVT variations. For instance the circuit could cope with malfunctions or signal variations of different circuitries within a larger integrated system. The OCD device includes a first compensator 110 and a second compensator 120. The first compensator 110 could be implemented as a PMOS compensator and the second compensator 120 as a NMOS compensator, or vice versa. The first compensator 110 receives a first PVT dependent signal from a source 130. Accordingly the second compensator 120 receives a second PVT signal from a second source 135. For the sake of simplicity only two compensators are shown in this embodiment but an implementation with a plurality of compensators is conceivable.

The PVT dependent signal sources 130 and 135 are depicted as current sources providing two PVT dependent currents. The currents are used as input signals for the first and second compensator 110 and 120, respectively. The compensators 110 and 120 are configured to detect signal variations due to PVT variations. The compensators correspondingly generate compensation signals which are subsequently used to drive an output or an output signal, for instance.

The first compensator 110 additionally receives a control signal from a first limiter 115. The limiter 115 is configured to control the operation of the compensator 110. The limiter 115 is configured to detect current variations within the compensator 110. If the variations follow an undefined operation of the compensator 110, the limiter 115 will provide a current, which is necessary to properly operate the compensator 110. For instance, if the PVT signal generated by the source 130 is too high or too low (i.e. zero) the limiter would secure a proper operation of the first compensator 110. For example, the compensator will maintain the signal within a range, and it is additionally supported by the limiter 115. Thus, a stable operation of the OCD device is ensured. Analog operation of the complementary compensator 120 and limiter 125 is provided.

The second compensator 120 receives a control signal from a second limiter 125. The limiters supply control signals to the compensators in response to operational data received from the corresponding compensators.

Further, the OCD device according to this embodiment includes an output driver 150 that receives compensated signals from the first and second compensators 110, 120, respectively. The output driver 150 also receives data via an input terminal IN. The output driver 150 may include a pre-driver and an output terminal to provide the data signal. The data signal may correspond to the output signal of an integrated circuitry, like for instance the data stored within a memory device or the like. The circuit according to this embodiment is configured to keep the slew rate of the output signal substantially constant independent of PVT variations. If PVT variations occur, the first and second compensators compensate for these signal variations and the output signal is driven to remain within the predefined conditions. The term predefined conditions relates to timing or shape specifications of an output signal for instance. According to the signals which are delivered from the PVT dependent current sources 130 and 135, the first and the second compensator 110 and 120 control the slew rate of the output OUT. According to one embodiment, the current limiters 115 and 125 deliver respectively a constant current which is independent from PVT variations. If the PVT dependent signals provided by the sources 130 and 135 are over a predetermined threshold, which could be caused by a technology process failure or malfunction, for example, the compensators 110 and 120 will operate according to the signal delivered from the respective limiters 115 and 125. That is, a failure within the system wherein the circuit according to this embodiment is integrated will not influence the operation of the compensators 110 and 120.

Figure 2:
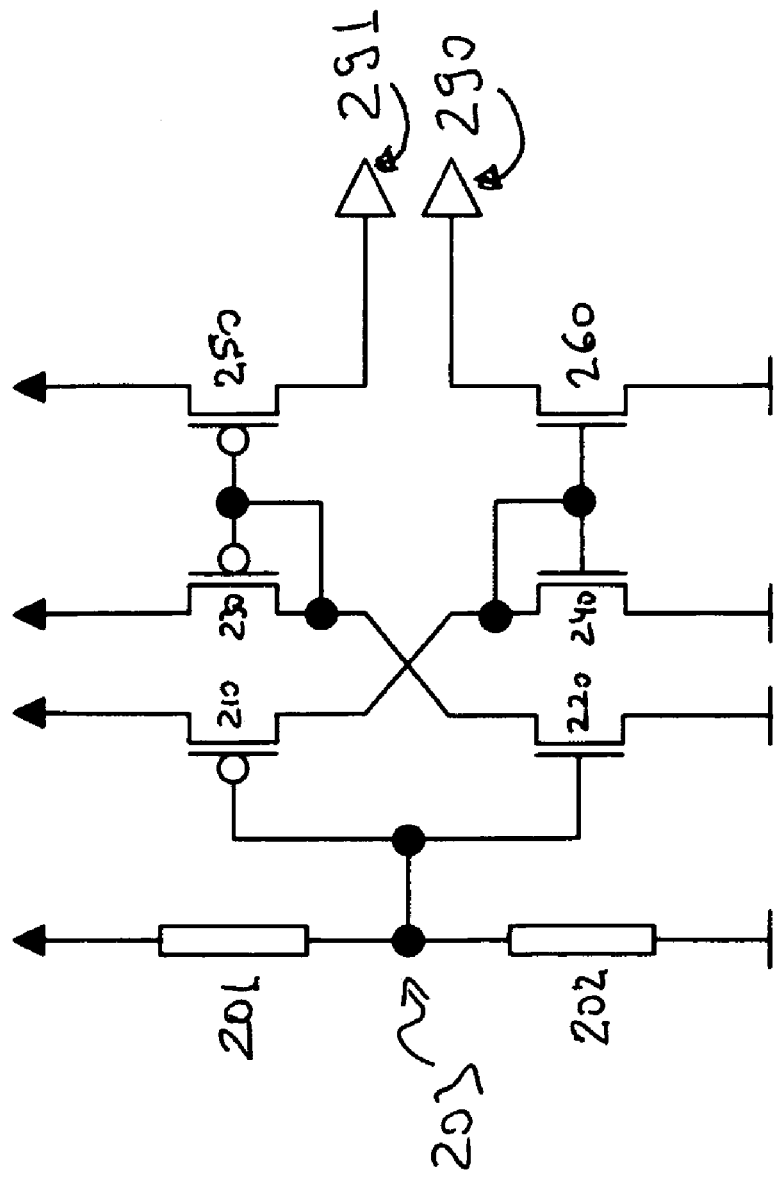
FIG. 2 is a schematic diagram of the PVT signal generation according to an embodiment of the invention.

FIG. 2 shows the generation of two PVT dependent signals (currents) according to one embodiment of the invention. According to this embodiment MOSFET transistors are implemented but other techniques are conceivable as well. The supply voltage may be the operation voltage of the integrated circuitry, but other voltages or potentials are configurable.

The left part of the circuit shows a voltage divider realized by two resistors 201 and 202. Herein, according to one embodiment, the resistances of both resistors 201 and 202 could be identical which means that the voltage divider will provide at node 203 half of the supply voltage VDD. The supply voltage is referenced with a black arrow through all figures of the description. In this embodiment, standard resistors are described but other components providing similar functionality could be used. The voltage provided at node 203 is used as an input signal to the gate terminals of the p-type transistor 210 and n-type transistor 220. The drain of the transistor 210 is connected to the drain of n-type transistor 240. The source terminal of transistor 210 is correspondingly connected to the supply voltage VDD.

Thus, the PVT dependent current of the p-type process is provided by the transistor 210. The current will be referenced as: $I_P=f(pvt)$ and accordingly the n-type transistor 220 will provide the n-type PVT dependent current $I_N=f(pvt)$. The p-type transistor 230 receives at its drain the PVT current $I_N$. Transistor 230 is connected as a mirror transistor and it will correspondingly mirror the PVT current to the p-type transistor 250. However, the output terminal 291 will receive the current depending on the n-type process $I_N$. In an analogous manner the output terminal 290 will receive the PVT dependent current $I_P$.

The MOS devices 210 and 220 monitor the driving strength of the output drivers i.e. if PMOS Driver has a certain strength defined by a combination of PVT (process, temperature, voltage) conditions, so does 210.

According to this embodiment the transistors 210 and 220 are biased with gate source voltage $V_{GS}$ of half the supply voltage (VDD/2). The static currents through 210 and 230, $I_P$ and $I_N$ are:

$$I_P(pvt) = K_P(pt) \cdot \left(\frac{VDD}{2} - V_{THP}(pt)\right)^2 \text{ and} \quad (1)$$

$$I_N(pvt) = K_N(pt) \cdot \left(\frac{VDD}{2} - V_{THN}(pt)^2\right) \quad (2)$$

where VDD is the supply voltage; $K_P$, $K_N$ and $V_{THP}$, $V_{THN}$ are process variables both varying over temperature and process.

It is assumed that if $I_P$ is high, the output driver is strong and therefore tends to perform a fast pull up resulting in a high slew rate. In order to reduce the slew rate the pull-up current has to be reduced, which will be described in the following.

The circuit of FIG. 2 provides stages of a device with two PVT dependent currents at the output terminals 291 and 290. These signals could be used to provide the PVT dependent signals 130 and 135 shown with reference to FIG. 1. It is conceivable that more than two currents are provided and other techniques to sense PVT variations are feasible.

Figure 3:
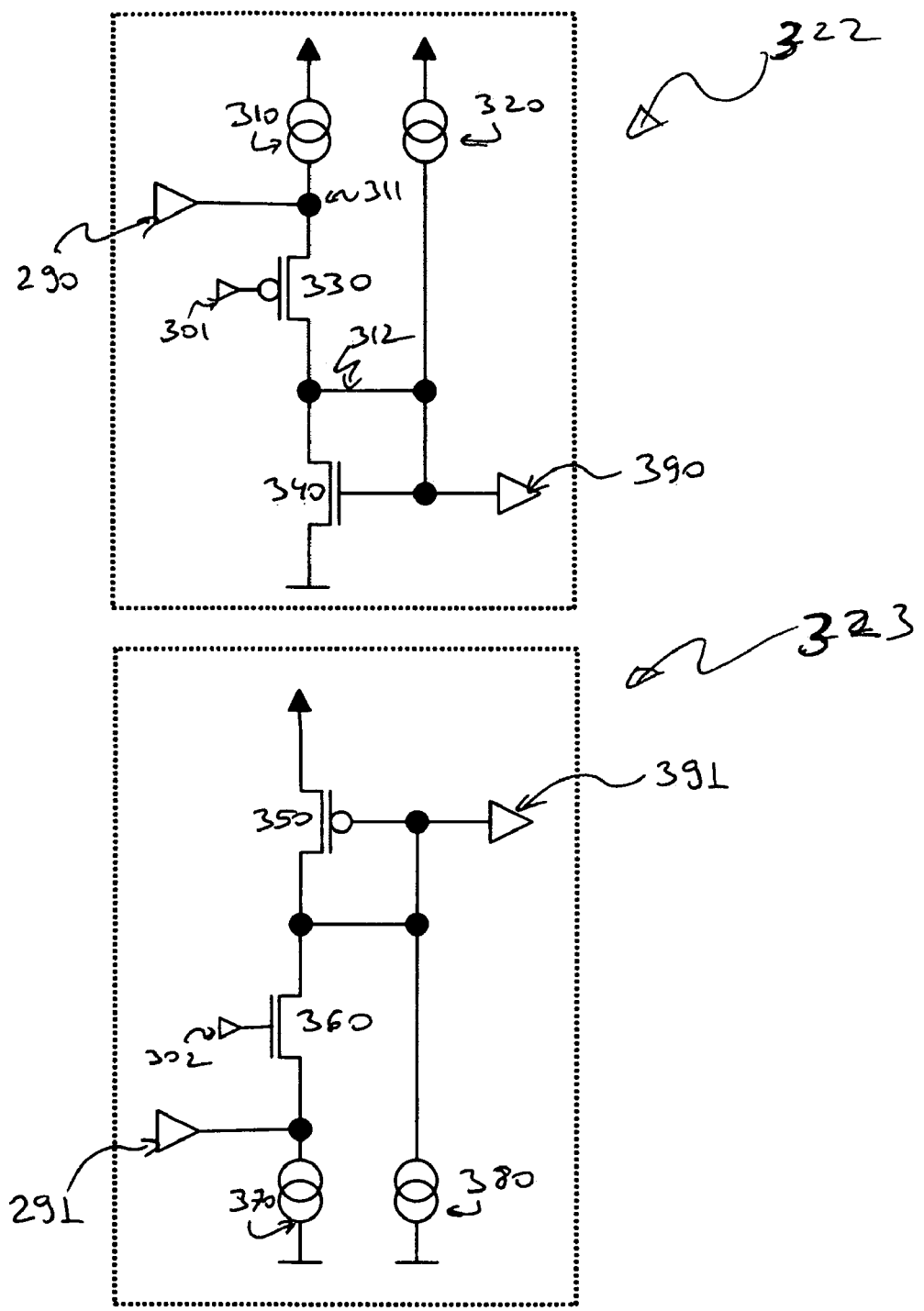
FIG. 3 shows two compensator devices according to an embodiment of the invention.

FIG. 3 shows two compensator devices and their corresponding limiter according to an embodiment of the invention. The upper part of FIG. 3 shows one embodiment of the PMOS compensator 110 and the lower part the NMOS compensator 120. According to an embodiment the limiter 115 and 125 are implemented as constant current sources 320 and 380, but other implementations are feasible.

The PMOS compensator or first compensator 322 operates in such a way that it compensates for PVT variations of the signal received at input 290. The NMOS compensator or second compensator 323 compensates for PVT variations of the signal received at input 291. The limiter devices 115 and 125 shown in FIG. 1 are implemented as current sources 320 and 380 in the embodiment shown in FIG. 3.

The PMOS compensator 322 and its corresponding limiter 320 in FIG. 3 contain the two current summing nodes: 311, 312 and two constant current sources 310 and 320. In the following the current through the current source 310 is referred to as $I_{const1}$ and the current through 320 is referred to as $I_{const2}$. For the sake of simplicity the current mirrors are depicted without cascode devices and ideal constant current sources are used.

The currents into node 312 correspond to: (3) $I_{pullup}= (I_{const\ 1}-I_P(pvt))+I_{const\ 2}$ which is subsequently mirrored across to 430 (see FIG. 4) and therefore defines the turn on performance of the PMOS driver transistor 470, depicted with reference to FIG. 4. A high value of $I_P$ indicates fast operating conditions. The resulting $I_{pullup}$ is small according to equation (3). $I_{const\ 1}-I_P(pvt)$ is bound at 0 and cannot become negative. Therefore the second constant current $I_{const\ 2}$ defines the lower limit of the ramp gradient at node A. The upper boundary of the gradient is defined by (4) $I_{pullupmin}= I_{const\ 1}+I_{const\ 2}$ in the case where $I_P(pvt)$ approaches 0.

The p-type transistor 330 decouples the nodes 311 and 312 and it additionally serves as a current sink. The current sink operates according to the difference between the constant current 320 and $I_P(pvt)$. The n-type transistor 360 operates in the same manner but for the complementary part (NMOS driver) of the circuitry.

For normal operation under typical conditions the pull up current is somewhere close to the centre between the two extreme cases $$I_{pullup}(\text{typical}) \approx \frac{I_{const1}}{2} + I_{const2} \quad (5)$$

and therefore $$I_P(pvt) \approx \frac{Iconst1}{2}. \quad (6)$$

The NMOS compensator 323 in FIG. 3 functions in the same manner, but in this case for the pull down path. It may be necessary to compensate the NMOS and PMOS paths separately because the manufacturing process corner can be different for PMOS and NMOS devices on the same silicon, for example fast NMOS and slow PMOS.

Figure 4:
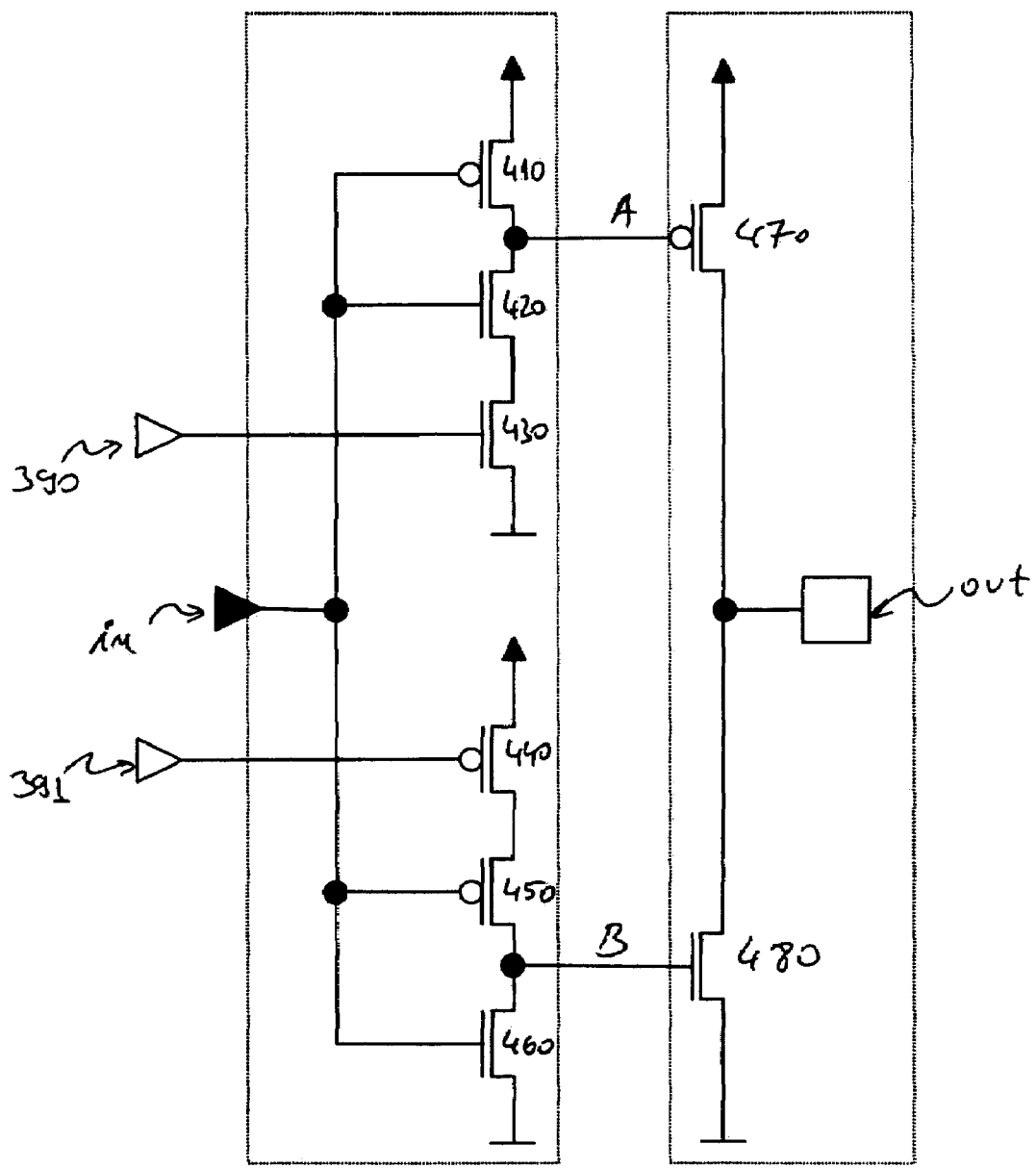
FIG. 4 shows the driver and an output device according to one embodiment of the invention.

The circuitry of FIG. 3 according to this embodiment provides the corresponding pull up current at the terminal 390 and the pull down current at the terminal 391 shown in FIG. 4.

FIG. 4 shows the output terminal together with the driver 150 according to an embodiment of the invention. The driver device receives the pull up and pull down signals at its input terminals 390 and 391. It should be noted that the same reference numbers for FIG. 3 are used and the terminals in FIG. 4 correspond to the terminals 390 and 391 in FIG. 3. The input terminal IN receives a data signal such as user data within a memory system or the like. It is feasible that this embodiment may be a part of a complex system like a Fully Buffered Dual Inline Memory Module (DIMM) or a Dynamic Random Access Memory (DRAM) or other type of memory or semiconductor device. The embodiment could be integrated within a CPU, for instance but also a separate integrated device is conceivable.

In the embodiment shown in FIG. 4, a pre-driver device is shown on the emphasized (dotted box) left part of FIG. 4 and an output driver which is shown on the right part of FIG. 4. The pre-deriver device may include two symmetrical/complementary parts corresponding to the pull up current and the pull down current. The pull up part of the pre-driver device receives the pull-up current via the NMOS transistor 430 and the input terminal 390. The current is mirrored by the mirror transistor 340 with reference to FIG. 3. NMOS transistor 420 receives the data connected via the input terminal IN. Additionally, the data input is also conveyed to a PMOS transistor 410. The pull down part of the circuitry operates in the similar way but for the pull down current or signal.

The slew rate of the output signal at the OUT terminal can be controlled by a voltage ramp on the gates of the output stage for nodes A and B [in accordance with FIG. 4]. The output devices, namely the p-type transistor 470 and the n-type transistor 480 are turned on slowly and off rapidly. For example if the current data on OUT is a 'one' and the next data will switch the output to 'zero', the PMOS (p-type) driver device 470 has to be turned off first by a fast rising voltage on node A and the NMOS (n-type) device 480 is turned on slowly by a ramp on node B (brake before make).

In general the ramp can be generated by a constant current charging a capacitor:

$$\frac{dV}{dt} = \frac{I}{C}. \quad (7)$$

Nodes A and B are heavily capacitively loaded by the NMOS driver device 480 and by the PMOS driver device 470, therefore the capacitance, which is to be loaded, exists already. The required ramp can be achieved by applying a current into these nodes. For the PMOS driver device 470 this current is applied by the NMOS device 430 to generate the negative ramp. The PMOS transistor 440 generates the positive ramp to node B.

In order to keep the slew rate on the output constant the gradient of the ramp has to vary according to the PVT corner conditions. The most extreme cases are: low temperature, high voltage, fast process which requires the smallest gradient or high temperature, low voltage and slow process which requires the highest gradient. Typically the circuit will operate somewhere in-between these extreme conditions.

According to another embodiment semiconductor device may include a plurality of slew rate controlled OCDs located within the corresponding output buffers. For efficient floor planning on chip-level the circuit concept can be partitioned as shown in the description. The reference current generator can be implemented only once and shared between all circuits. It is assumed that the far distance matching of large devices is sufficient so that driver transistors can be regarded as substantially equal and matched with transistors 210 and 220 shown in FIG. 2. The two output currents $I_{pull\ down}$ and $I_{pull\ up}$ through the devices 430 and 440 could be multiplied and supplied to each individual OCD driver.

According to another embodiment of the invention, a band-gap reference current generator may be used to provide the substantially PVT independent currents.

Figure 5:
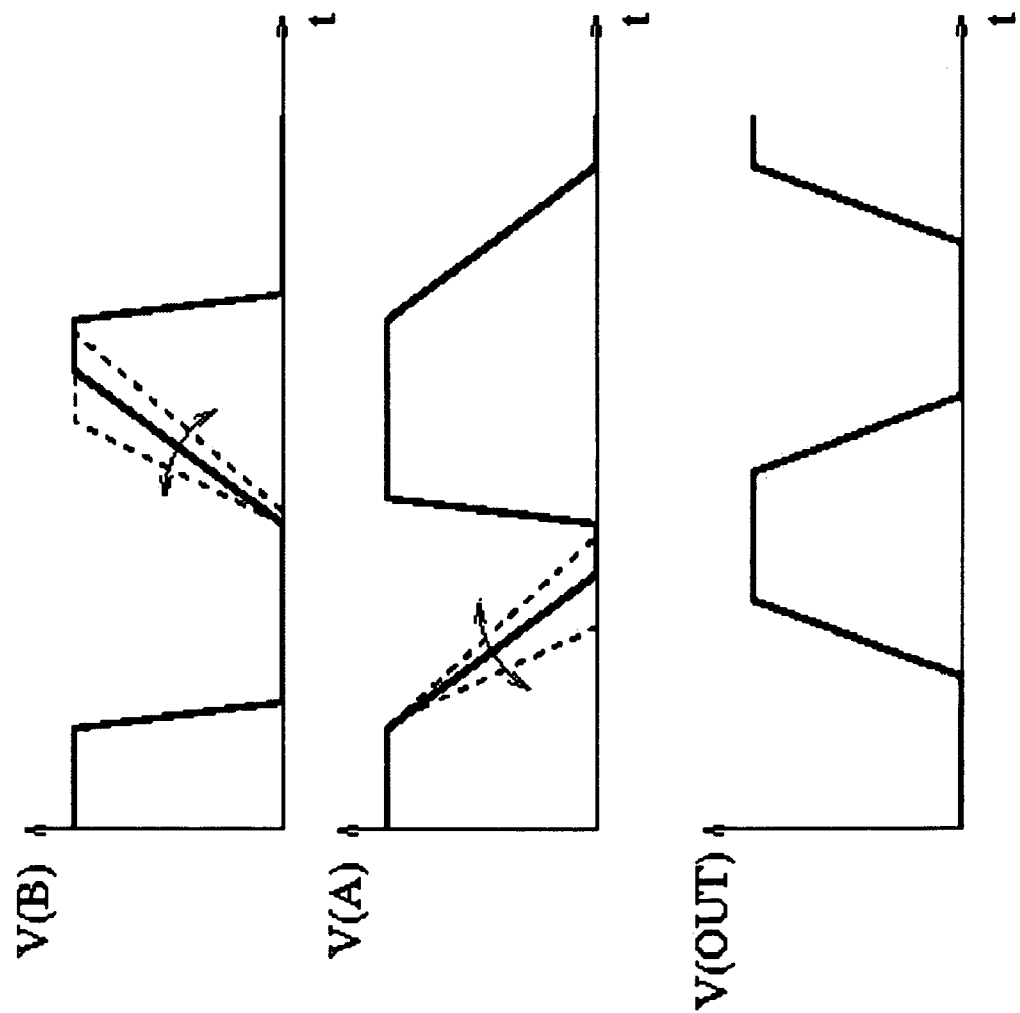
FIG. 5 shows signal shapes of the circuitry according to one embodiment of the invention.

FIG. 5 shows the voltage gradients of the corresponding nodes A and B according to the embodiment of FIG. 3. The voltage curves V(A) and V(B) show the gradients of the voltages at the nodes A and B. These voltages are used as control signals for the transistors 470 and 480, shown in FIG. 4. The gradient of the output signal OUT is shown with reference to the curve V(OUT). All voltages are shown related to a common time scale t. The slew rate of the output signal on the OUT terminal can be controlled by a voltage ramp on the gates of the corresponding driver transistors 470 and 480. For example, if the current data on the OUT terminal is a 'one' and the next data will switch the output to 'zero', the PMOS driver transistor 470 has to be turned off first by a fast rising voltage on node A and the NMOS driver transistor 480 is turned on slowly by a ramp on node B. The slew rate of the output voltage can be controlled to be substantially constant by adjusting the inclination of the voltage ramps V(A) and V(B). This can be important if the output voltage gradient is defined within a specification or data sheet of a semiconductor device, for instance.

Figure 6:
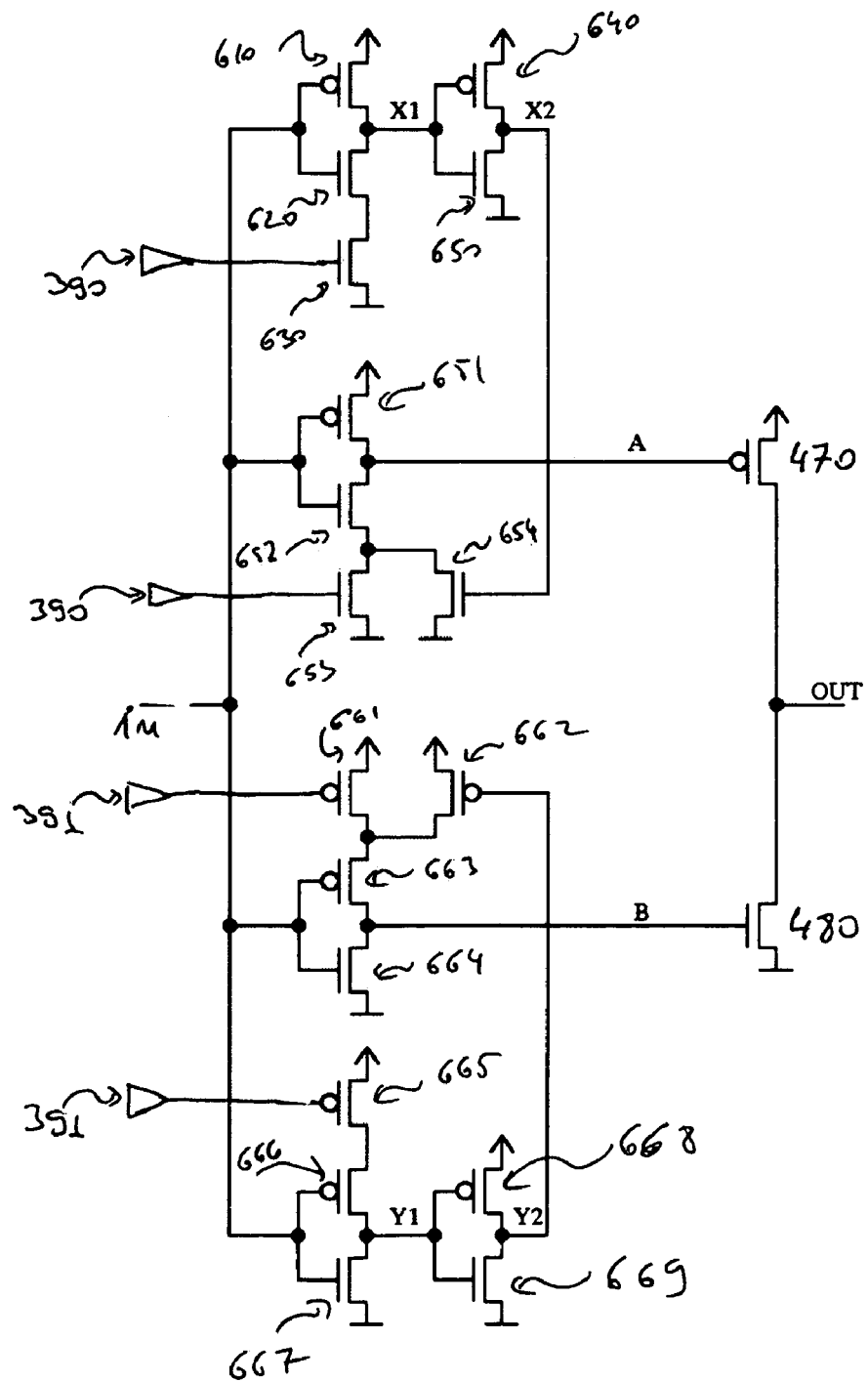
FIG. 6 shows an accelerator device according to one embodiment of the invention.

FIG. 6 shows an accelerator device in accordance with another embodiment of the invention. The accelerator device may be connected, as shown, to the corresponding terminals 390 and 391. The output driver including the output transistors 470 and 480 can be coupled to the accelerator device at the nodes A and B.

Thus, the additional accelerator device is added to the pre-driver stage of the output driver. For the sake of simplicity only the upper part of the circuit of FIG. 6 is described. The lower part, which is coupled to the NMOS driver 323 operates in a similar manner. Terminal 390 drives the accelerator which is shown in the upper part of FIG. 6. The output from terminal 390 is supplied to the input gate of NMOS transistors 630 and 653. The data at terminal IN is supplied to the input of two CMOS inverters formed by the transistors 610, 620 and 651, 652 respectively. Transistor 630 operates as a delimiter for the current through the transistor 620 and it controls the signal at the output X1. The output node X1 of the CMOS inverter including transistors 610 and 620 is supplied to an additional CMOS inverter including transistors 640 and 650 with an output node X2. The signal at node X2 is supplied to the input gate of transistor 654. This transistor is used to connect the node A to ground. The signal at node 390 is supplied to a NMOS transistor 653 that is coupled to a CMOS inverter including the transistors 651 and 652. The transistor 654 is also connected to the inverter formed by the transistors 651 and 652. The input of this inverter corresponds to the data input at input terminal IN.

The lower part of FIG. 6 corresponding to the NMOS driver stage is symmetrically implemented with reference to the upper part of FIG. 6.

Figure 7:
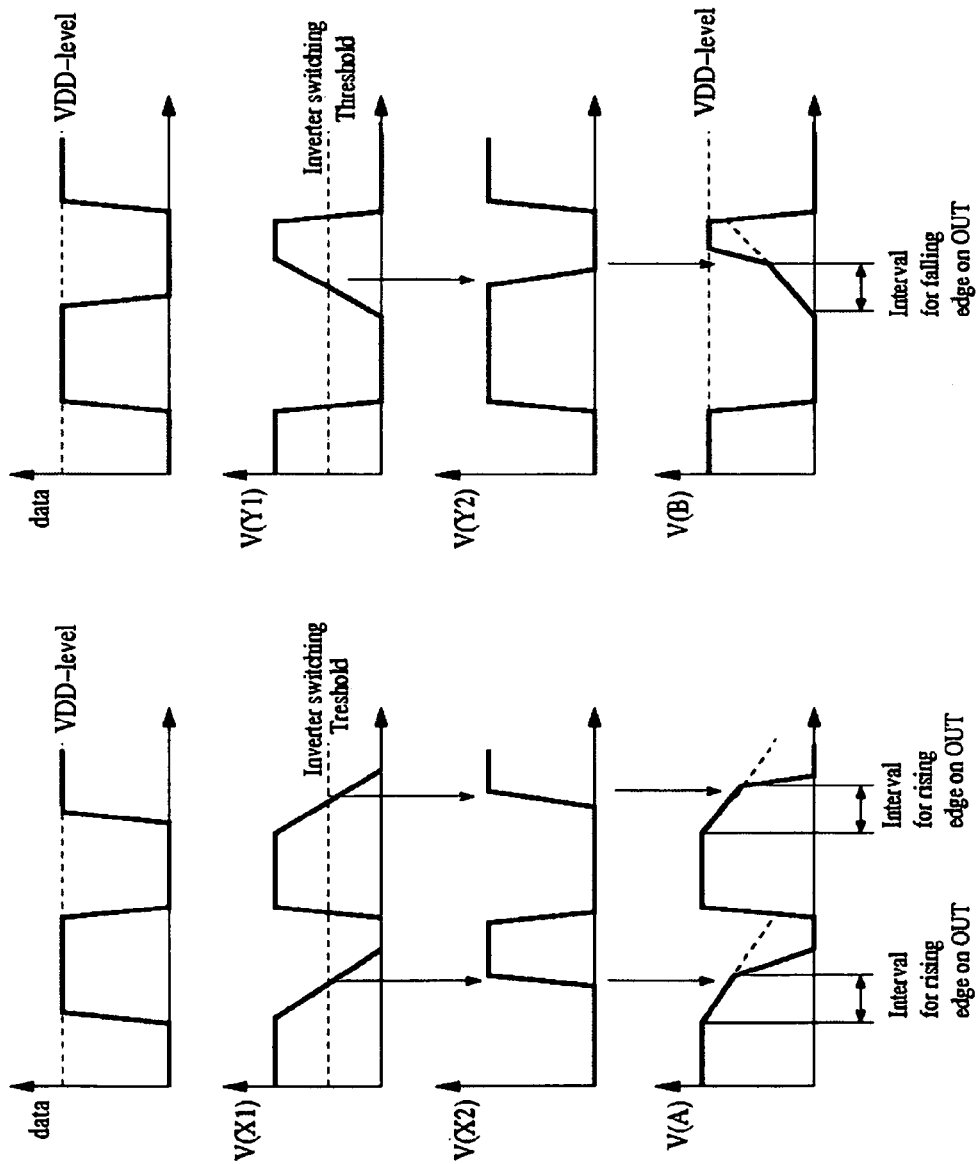
FIG. 7 shows the voltage gradients of specific nodes according to one embodiment of the invention.

In this embodiment of the invention, the additional functionality may be added to the pre-driver stage for the following reasons. The wave forms for node A and B as shown in FIG. 5 contain a ramp of variable gradient as already explained in detail and for fast operating conditions this ramp becomes more flat. However, for high speed grades, and therefore short data pulses, it might happen that the slope never reaches the supply voltage potential before the next opposite data is driven. This scenario can cause data dependent jitter. FIG. 7 shows how the wave forms on the pre-driver output node A and B in FIG. 6 change from a) to b) by implementing the additional circuitry shown in FIG. 6.

The wave forms on the left side of FIG. 7 illustrate the PMOS driver 470 of the output driver and the right side of FIG. 7 illustrates the NMOS driver 480 signals. An additional ramp X1 is generated using the same reference current as for node A (mirrored current from node 390). This ramp is scaled to be faster than the one on A. The gradient on X1 does not have to be as accurate as the one on A. As soon as this ramp has reached the switching threshold of the inverter between X1 and X2, X2 switches and generates a rising edge on the gate of NMOS transistor 654. Subsequently the NMOS transistor 654 turns on and accelerates the discharge from node A to ground. The ramp on A therefore changes its gradient and becomes faster. However, the rising edge on the output signal at the OUT terminal has to be settled to its maximum value, otherwise the rising edge would also change its gradient, which is undesired.

The complementary functionality is added to the NMOS pre-driver circuit of FIG. 4, described above, which is connected to the NMOS driver transistor 480.

Further, according to another embodiment of the invention, a memory system including a compensated output driver is provided. The output driver could be implemented as aforementioned to control the slew rate of the output signal. The slew rate is controlled by sensing PVT variations within the memory system and maintaining a constant slew rate despite the PVT variations.

According to another embodiment, the memory system is a fully buffered DIMM memory system. The compensated output driver could be implemented within the advanced memory buffer or the controller, respectively for instance, ensuring that the data output signal will have a controlled slew rate. The advanced memory buffer operates as a controller for this memory system.

Even though the invention is described above with reference to embodiments according to the accompanying drawings, it is clear that the invention is not restricted thereto but it can be modified in several ways within the scope of the appended claims.

What is claimed is:

1. A semiconductor device, comprising:
   a first compensator to generate a first compensated signal having a controlled slew rate in response to a first input signal;
   a first limiter, coupled to the first compensator, to control operation of the first compensator;
   a second compensator to generate a second compensated signal having a controlled slew rate in response to a second input signal;
   a second limiter, coupled to the second compensator, to control operation of the second compensator; and
   an output device that receives the first compensated signal and the second compensated signal to drive an output signal.

2. A semiconductor device according to claim 1,
   wherein the first compensator receives a first process supply voltage and temperature (PVT) dependent signal and the second compensator receives a second PVT dependent signal.

3. A semiconductor device, according to claim 2, further comprising a pre-driver to receive the first and second compensated signal and the data signal to provide a pre-drive signal to an output driver.

4. A semiconductor device according to claim 3,
   wherein said driver comprises an accelerator device to accelerate the pre-drive signal.

5. A semiconductor device, according to claim 1, further comprising an input terminal to receive a data signal and an output terminal to provide data to said output.

6. A semiconductor device, according to claim 1,
   wherein the first compensator is a PMOS compensator and the first limiter is a PMOS limiter.

7. A semiconductor device according to claim 6,
   wherein the PMOS limiter comprises a current source to provide a limiting current and a NMOS bias transistor.

8. A semiconductor device, according to claim 1,
   wherein the second compensator is a NMOS compensator and the second limiter is a NMOS limiter.

9. A semiconductor device according to claim 8,
   wherein the NMOS limiter comprises a current source to provide a limiting current and a NMOS bias transistor.

10. A semiconductor device according to claim 1,
    wherein said device is a slew rate controller device.

11. Memory system, comprising a semiconductor device according to claim 1.

12. A semiconductor device, comprising:
    a PMOS compensator to generate a PMOS compensated signal and a PMOS limiter to control operation of the PMOS compensator;
    a NMOS compensator to generate a NMOS compensated signal and a NMOS limiter to control operation of the NMOS compensator; and
    an output driver adapted to receive the PMOS compensated signal and the NMOS compensated signal to drive an output.

13. A semiconductor device according to claim 12,
    wherein the NMOS compensator and the PMOS compensator compensate process supply voltage and temperature (PVT) variations.

14. A semiconductor device according to claim 12,
    wherein the PMOS compensator and the NMOS compensator generate substantially PVT dependent signals.

15. A semiconductor device according to claim 12,
    wherein the NMOS limiter comprises a current source to provide a limiting current which is essentially independent of PVT variations and a NMOS bias transistor.

16. A semiconductor device according to claim 12,
    wherein the PMOS limiter comprises a current source to provide a limiting current which is essentially independent of PVT variations and a NMOS bias transistor.

17. A method for driving an output of a semiconductor device, comprising:
    receiving a first process-voltage-temperature (PVT) signal and a second process-voltage-temperature (PVT) signal;
    generating a first compensated signal based on said first process-voltage-temperature (PVT) signal;
    generating a second compensated signal based on said second process-voltage-temperature (PVT) signal; and driving an output according to said first and second compensated signals.

18. Method according to claim 17, further comprising:
controlling the generation of said first compensated signal; and
controlling the generating of said second compensated signal.

19. Method according to claim 18, wherein said controlling is based on a corresponding first a second limiting signal, said first and second limiting signals being essentially independent of PVT variations.

20. Method according to claim 18, wherein said semiconductor device is an integrated memory device.

21. Method according to claim 18, wherein said semiconductor device is a DRAM device.

22. Memory system according to claim 21, wherein said system is a fully buffered DIMM memory system having a controller with an integrated semiconductor device according to claim 1.

* * * * *